(12) United States Patent
Kumar et al.

(10) Patent No.: US 9,130,033 B2
(45) Date of Patent: Sep. 8, 2015

(54) SEMICONDUCTOR DEVICE AND METHOD FOR FABRICATING THE SAME

(71) Applicant: Vanguard International Semiconductor Corporation, Hsinchu (TW)

(72) Inventors: Manoj Kumar, Jharkhand (IN); Priyono Tri Sulistyanto, Yogyakarta (ID); Chia-Hao Lee, New Taipei (TW); Rudy Octavius Sihombing, Medan (ID); Shang-Hui Tu, Jhubei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 14/095,599

(22) Filed: Dec. 3, 2013

(65) Prior Publication Data

US 2015/0155379 A1    Jun. 4, 2015

(51) Int. Cl.
*H01L 29/66* (2006.01)
*H01L 29/78* (2006.01)
*H01L 29/06* (2006.01)
*H01L 29/08* (2006.01)

(52) U.S. Cl.
CPC ........ *H01L 29/7813* (2013.01); *H01L 29/0611* (2013.01); *H01L 29/0852* (2013.01); *H01L 29/66734* (2013.01)

(58) Field of Classification Search
CPC .................. H01L 21/26513; H01L 21/76229; H01L 21/8249

USPC ......... 438/241, 259, 270, 700, 761, 514, 524, 438/542; 257/329, 330, 332, 342, E27.091, 257/E29.257, E29.26, E21.545, E21.546, 257/E21.548, E21.553, E21.585

See application file for complete search history.

(56) References Cited

U.S. PATENT DOCUMENTS

| 2004/0031987 | A1* | 2/2004 | Henninger et al. | ........... 257/328 |
| 2006/0113627 | A1* | 6/2006 | Chen et al. | ...................... 257/500 |
| 2009/0256212 | A1* | 10/2009 | Denison et al. | ................ 257/408 |
| 2013/0069144 | A1* | 3/2013 | Mathew et al. | ................ 257/330 |

FOREIGN PATENT DOCUMENTS

| JP | 2001-15742 A | 1/2001 |
| JP | 2008-182106 A | 8/2008 |
| WO | WO 2012/121952 A2 | 9/2012 |

* cited by examiner

*Primary Examiner* — Kyoung Lee
*Assistant Examiner* — Joannie A Garcia
(74) *Attorney, Agent, or Firm* — Birch, Stewart, Kolasch & Birch, LLP

(57) ABSTRACT

The invention provides a semiconductor device, including: a semiconductor device includes: a substrate having a first conductivity type, including: a body region having the first conductivity type; a source region formed in the body region; a drift region having a second conductivity type adjacent to the body region, wherein the first conductivity type is opposite to the second conductivity type; and a drain region formed in the drift region; a trench formed in the substrate between the body and drift regions; a gate dielectric layer disposed adjacent to the trench; a liner lining the trench and adjoining with the gate dielectric layer; and a gate electrode formed over the gate dielectric layer and extending into the trench.

24 Claims, 11 Drawing Sheets

SEMICONDUCTOR DEVICE AND METHOD FOR FABRICATING THE SAME

BACKGROUND OF THE INVENTION

1. Field of the Invention

The present invention relates to a semiconductor device, and in particular, relates to a semiconductor device having a trenched gate electrode with very low on-resistance and a method for fabricating the same.

2. Description of the Related Art

Two or more semiconductor devices are being integrated into one chip, as demand for high yield devices increase. Bipolar-CMOS-LDMOSs (BCDs) have been widely used in device integration. BCD technology integrates bipolar, complementary metal-oxide-semiconductor (CMOS) and laterally diffused metal-oxide-semiconductor (LDMOS) technology into one chip. In a BCD device, a bipolar device is used to drive high currents, a CMOS provides low power consumption for digital circuits, and an LDMOS device provides high voltage (HV) handling capabilities.

LDMOS devices are widely used in various applications. On-resistance is an important factor that is directly proportional to the power consumption of an LDMOS device. As the demand for power savings and better performance of electronic devices increase, manufacturers have continuously sought to reduce the leakage and on-resistance (Ron) of LDMOS devices. However, the reduction of on-resistance is closely related to the high off-state breakdown voltage. Specifically, reducing the on-resistance leads to a substantial drop of the high off-state breakdown voltage. Thus, while conventional LDMOS devices are able to deliver a high off-state breakdown voltage, they fail to provide low on-resistance.

An LDMOS device includes a drift region, and a body region. It has been observed that the on-resistance of the conventional LDMOS device decreases when the dopant concentration of the drift region increases. However, the high off-state breakdown voltage of the LDMOS decreases as the doping concentration increases.

Thus, an improved semiconductor device having a low on-resistance without deficiencies related to the breakdown voltage and a method for fabricating the same are needed.

BRIEF SUMMARY OF THE INVENTION

An exemplary embodiment of a semiconductor device including: a substrate having a first conductivity type, including: a body region having the first conductivity type; a source region formed in the body region (having a second conductivity type); a drift region having a second conductivity type adjacent to the body region, wherein the first conductivity type is opposite to the second conductivity type; and a drain region formed in the drift region; a trench formed in the substrate between the body and drift regions; a gate dielectric layer disposed adjacent to the trench; a liner lining the trench and adjoining with the gate dielectric layer; and a gate electrode formed over the gate dielectric layer and extending into the trench.

Another exemplary embodiments of a semiconductor device, including: a substrate having a first conductivity type having a body region; a pair of diffusion extension regions having a second conductivity type extending from a top surface of the body region into the body region, wherein the second conductivity type is opposite to the first conductivity type; a source region formed in one of the diffusion extension regions and a drain region formed in another one of the diffusion extension regions; a trench formed in one of the diffusion extension regions and extending into a portion of the body region between the pair of diffusion extension regions; a gate dielectric layer disposed adjacent to the trench; a liner lining the trench and adjoining with the gate dielectric layer; and a gate electrode formed over the gate dielectric layer and extending into the trench.

An exemplary embodiment of a method for fabricating a semiconductor device including: providing a substrate having a first conductivity type; forming a body region having the first conductivity type in the substrate; forming a drift region having a second conductivity type adjacent to the body region in the substrate, wherein the second conductivity type is opposite to the first conductivity type; forming a shallow trench isolation (STI) in the substrate between the body and drift regions; forming a dielectric layer over the substrate; removing the STI and a portion of the dielectric layer to form a trench and a gate dielectric layer adjacent to the trench, respectively; forming a liner lining the trench and adjoining with the gate dielectric layer; forming a gate electrode over the gate dielectric layer and extending into the trench; and forming a source region in the body region and a drain region in the drift region.

Another exemplary embodiment of a method for fabricating a semiconductor device including: providing a substrate having a first conductivity type; forming a body region having the first conductivity type in the substrate; forming a pair of diffusion extension regions having a second conductivity type in the body region, wherein the second conductivity type is opposite to the first conductivity type; forming a shallow trench isolation (STI) in one of the diffusion extension regions, wherein the STI extends into a portion of the body region between the pair of diffusion extension regions; forming a dielectric layer over the substrate; removing the STI and a portion of the dielectric layer to form a trench and a gate dielectric layer adjacent to the trench, respectively; forming a liner lining the trench and adjoining with the gate dielectric layer; forming a gate electrode over the gate dielectric layer and extending into the trench; and forming a source region in one of the diffusion extension regions and a drain region in the other one of the diffusion extending regions.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
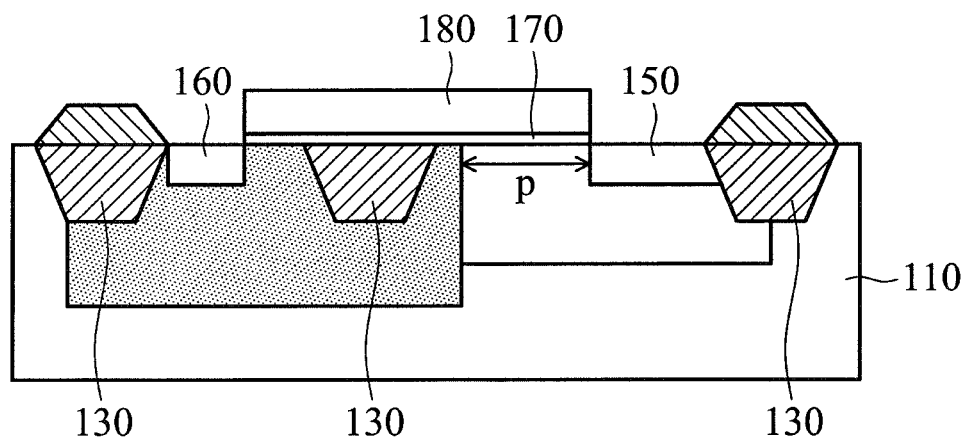
FIG. 1 is cross-sectional view of a conventional semiconductor device.

The following description is of the best-contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

Referring to FIG. 1, a cross-sectional view of a conventional semiconductor device 100 is illustrated. The semiconductor device 100 comprises a substrate 110 having, a body region 112 and a drift region 114 formed in the substrate 110. The substrate 110 further comprises a plurality of shallow trench isolations (STIs) 130 formed therein. In the conventional semiconductor device 100, the STIs 130 are trenches filled with dielectric material, such as silicon oxide. Other common elements are also included in the semiconductor device 100, for examples, source and drain regions 150 and 160, a gate dielectric layer 170, and a gate electrode 180. It is noted that the on-resistance ($R_{on}$) is directly proportional to pitch P of the semiconductor device.

The invention provides an improved semiconductor device with reduced the $R_{on}$ by shortening the pitch without prejudice to the breakdown voltage.

Figure 2A:
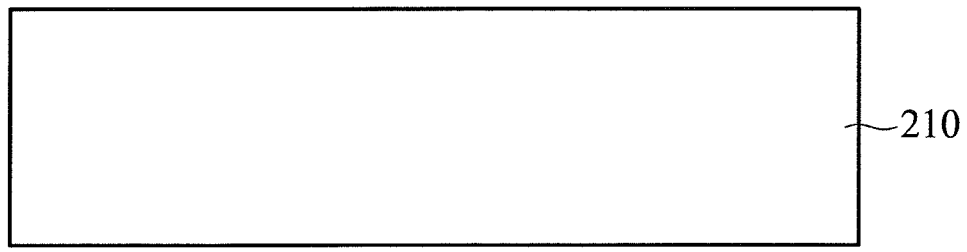
FIG. 2a-2j illustrate a step-by-step procedure for fabricating a semiconductor device in accordance with embodiments of the present disclosure.
Figure 2B:
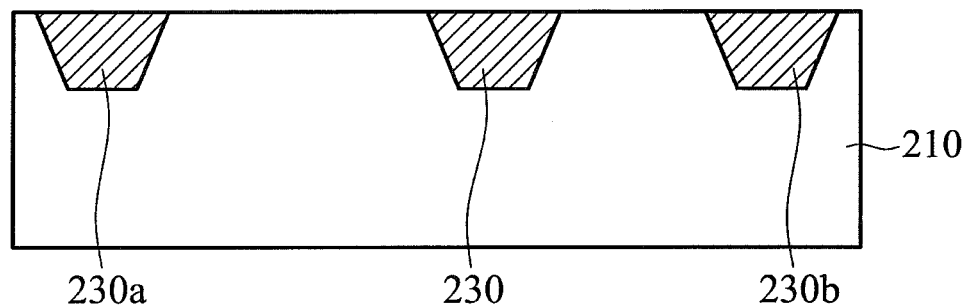
Figure 2C:
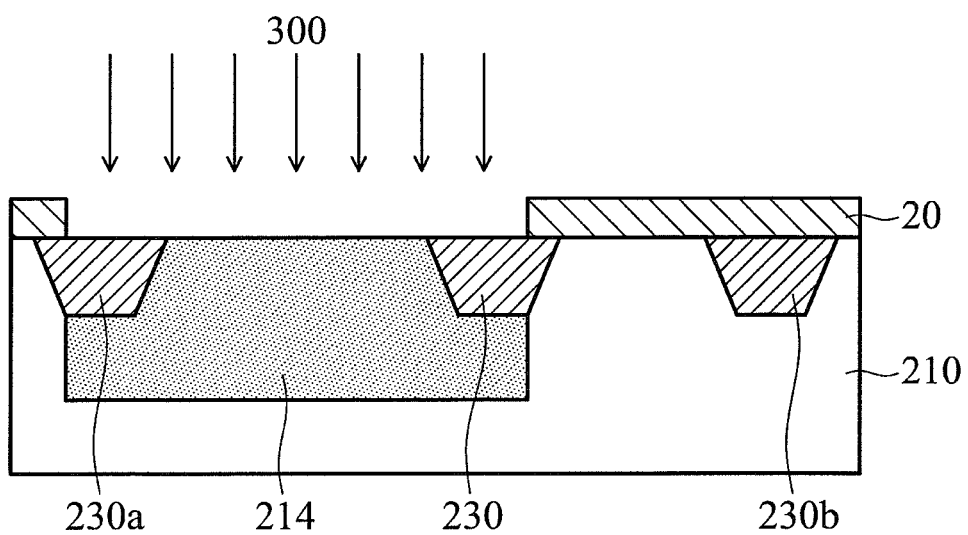
Figure 2D:
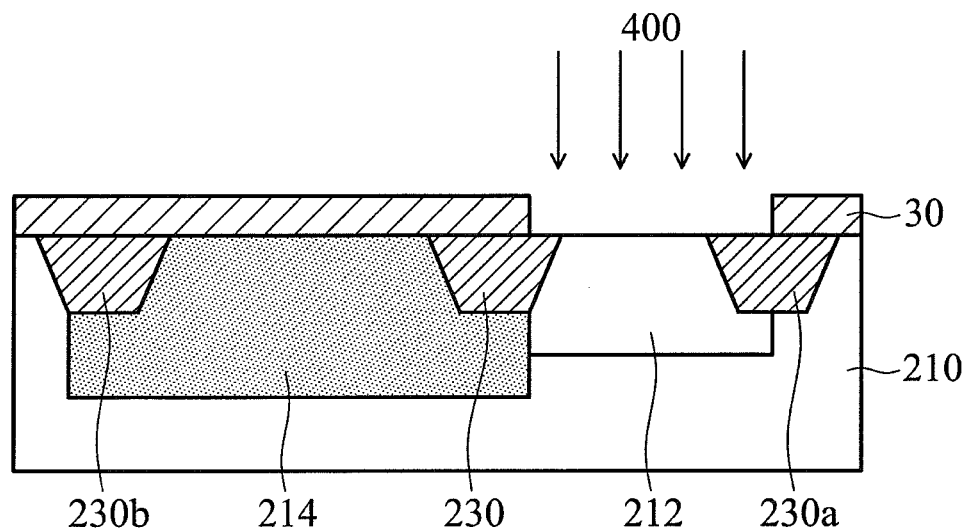

FIGS. 2a-2j illustrate a step-by-step procedure for fabricating a semiconductor device 200 in accordance with embodiments of the present disclosure, in which FIGS. 2a-2c illustrate the formation of a body region and a drift region of the semiconductor device 200. Referring to FIG. 2a, a substrate 210 having a first conductivity type is provided. The substrate 210 may be a bulk silicon substrate, a silicon-on-insulator (SOI) substrate, or the like. In some embodiments, the substrate 210 may have a first conductivity type of p-type, such as a boron doped substrate. In other embodiments, the substrate 210 may have a first conductivity type of n-type, such as a phosphor or arsenic substrate. Any other suitable substrates may also be used, such as a compound semiconductor substrate, or multilayer substrate, or the like.

Referring to FIG. 2b, a plurality of isolation structures 230, 230a, and 230b are formed. In an embodiment, the isolation structures 230, 230a, and 230b may be shallow trench isolations (STIs). Conventional processes for forming STIs may be used to form the STI 230, and hence are not illustrated in detail in the figures. Such processes may include: sequentially forming a first insulating layer (for example, silicon oxide ($SiO_x$) and a second insulating layer (for example, silicon nitride ($SiN_x$)) over the substrate 210; forming a trench in the substrate 210 by selectively etching the first and second insulating layers and the substrate 210; growing a liner that is rich in nitrogen (for example, silicon oxynitride ($Si_xO_yN_z$)) on the surface or sidewalls of the trench; depositing (by a deposition process, such as chemical vapor deposition (CVD)) a gap fill material (for example, silicon dioxide, or borophososilicate glass) on the surface of the substrate 210, wherein the gap fill material fills the trench; applying an anneal process to the gap fill material; and planarizing (by conventional method such as chemical mechanical polish (CMP)) the substrate 210 to remove the excess gap fill layer such that the portion of gap fill material in the trench is level with the top surface of the substrate. It should be noted that, the above processes are merely examples, and hence the invention should not be limited to it.

Referring to FIG. 2c, after the formation of the isolation structures 230, 230a, and 230b, a patterned mask layer 20 is formed over the substrate 210, exposing a predetermined drift region. The patterned mask layer 30 may be a photoresist layer or a hard mask layer such as a silicon nitride or a silicon oxynitride layer or the like. A doping process 300 is performed to selectively dope a dopant having a second conductivity type, into the semiconductor substrate 210 to define a drift region 214. The second conductivity type is different from the first conductivity type. The patterned mask layer 20 is removed after the drift region 214 is formed Referring to 2d, a patterned mask layer 30 is formed over the substrate 210, exposing a predetermined body region following the formation of the drift region 214. The patterned mask layer 30 may be a photoresist layer or a hard mask layer such as a silicon nitride or a silicon oxynitride layer or the like. After the mask layer 30 is formed, a doping process 400 is performed to selectively dope a dopant of a first conductivity type, into the semiconductor substrate 210 to define a body region 212. In some exemplary embodiments, the concentration of the substrate 210 may be greater than that of the body region 212. For example, when the body region 212 is p-type, the substrate 210 may be doped with heavily doped p-type (P+). The mask layer 30 is then removed after the body region 212 is formed.

Figure 2E:
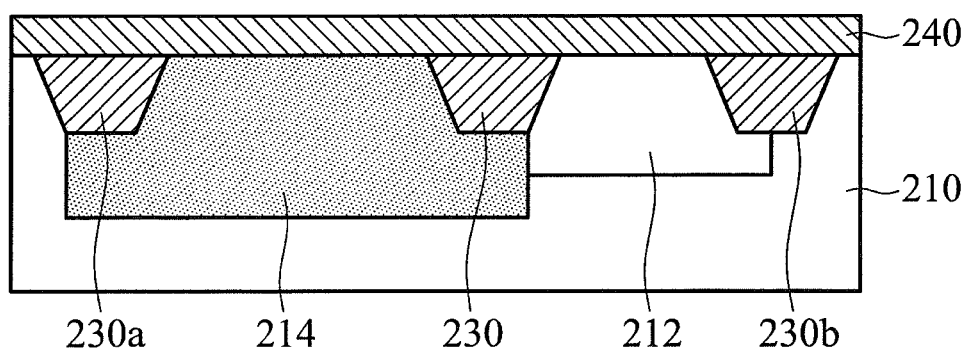

After the body region 212 and the drift region 214 are formed, a dielectric layer 240 is formed over the substrate 210 as shown in FIG. 2e. The dielectric layer 240 comprises silicon oxide, silicon nitride, silicon oxynitride, high-k dielectrics, other suitable dielectric materials for gate dielectrics, or combinations thereof. High-k dielectrics may comprise metal oxides, for example, oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. The dielectric layer 240 may be formed by an ordinary process known in the art, such as atomic layer deposition (ALD), chemical vapor deposition (CVD), physical vapor deposition (PVD), thermal oxidation, UV-ozone oxidation, or combinations thereof. The dielectric layer 240 may have a thickness from about 2000 angstroms to 10,000 angstroms.

Figure 2F:
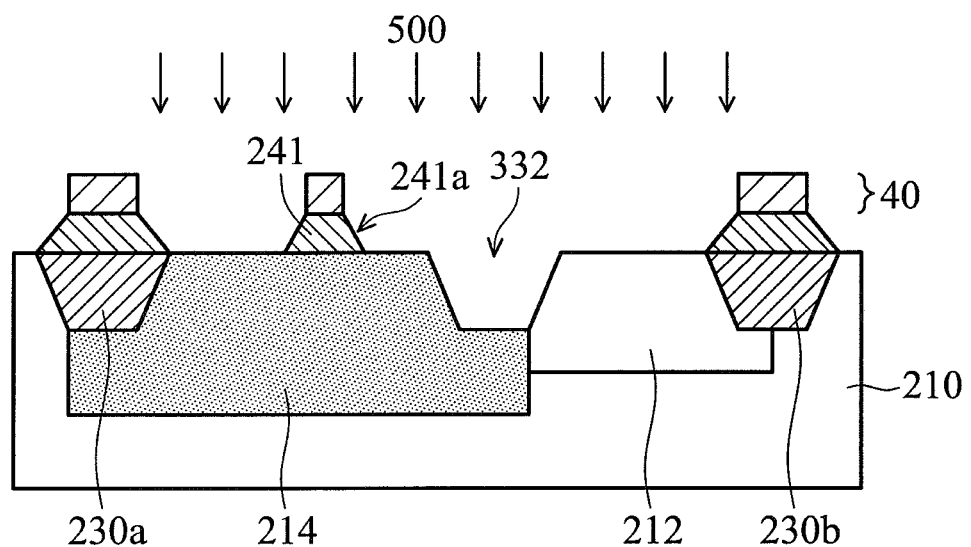

Referring to FIG. 2f, an etching process 500 is performed using a patterned mask layer 40 to remove the isolation structure 230 to form a trench 232 between the body and drift regions 212 and 214, and remove a portion of the dielectric layer 240 to form a gate dielectric layer 241 adjacent to the trench 232. The gate dielectric layer 241 may have a slant sidewall 241a formed on at least one of its edges. It should be realized, although the FIG. 2f shows a slant sidewall, the sidewall 241 may be a vertical sidewall or in any other suitable shapes. The etching process 500 may be a dry etching process, wet etching process, or the like. The patterned mask layer 40 may be a photoresist layer or a hard mask layer such as a silicon nitride or a silicon oxynitride layer or the like. The patterned mask layer 40 is removed after the etching process 500.

Figure 2G:
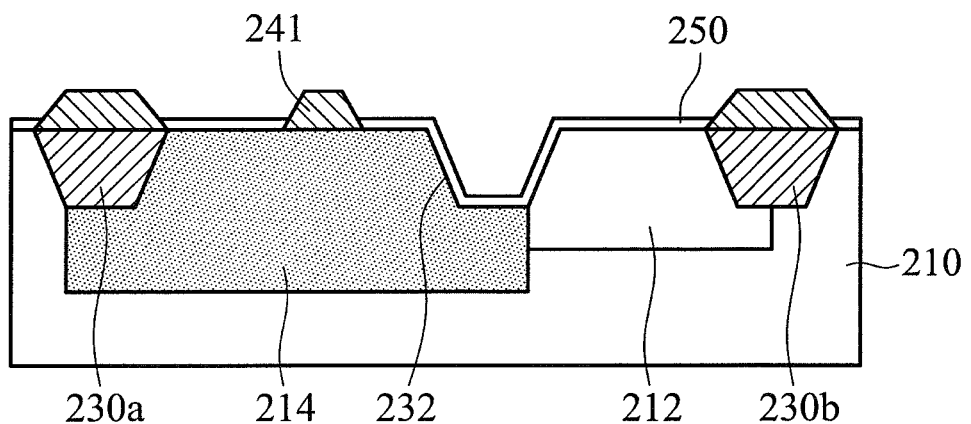

Referring to FIG. 2g, a liner 250 lining the trench 232 and adjoining with the gate dielectric layer 241 is formed. The liner 250 may also cover the top surface of the substrate exposed by the gate dielectric layer 241. In an embodiment, the liner 250 may be formed by oxidizing the substrate 210 through an oxidation process, such as a thermal oxidation, UV-zone oxidation, or the like. In another embodiment, the liner 250 may be formed by a deposition process, such as chemical vapor deposition (CVD), physical vapor deposition (PVD), or the like. The liner 250 may be thinner than the gate dielectric layer 241. In some embodiments, the liner 250 may have a thickness of between about 100-500 angstroms.

Figure 2H:
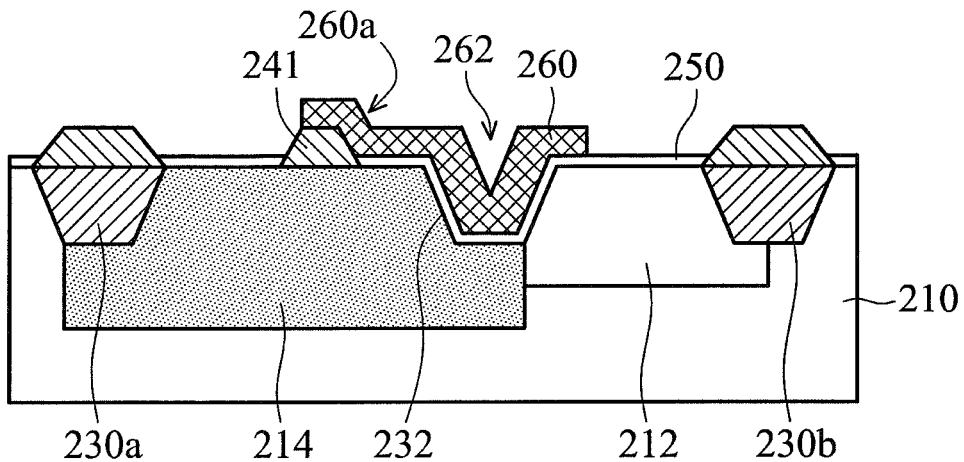
Figure 2I:
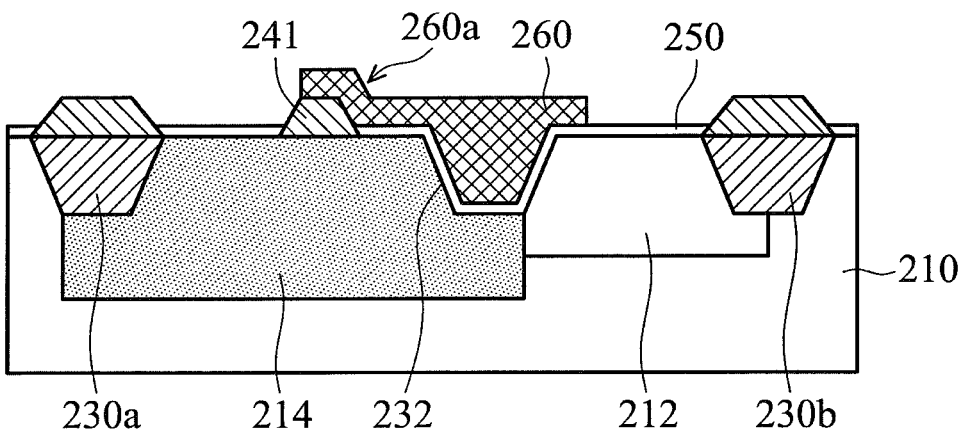

Referring to FIG. 2h, a gate electrode 260 is formed over the gate dielectric layer 241 and a portion of the liner 250. The gate electrode 260 at least partially extends into the trench 232. The gate electrode 260 may be formed of a material comprising metal, polysilicon, tungsten silicide (WSi$_2$), or combinations thereof. The gate electrode 260 may be formed using a process such as low-pressure chemical vapor deposition (LPCVD), plasma enhanced chemical vapor deposition (PECVD), other suitable processes, or combinations thereof. The gate electrode 260 may have a step 260a owing to the height difference between the gate dielectric layer 241 and the liner 250. In one embodiment, the gate electrode 260 may be conformally formed in the trench, thus providing a concave portion 262 corresponding to the trench 232. In another embodiment, the gate electrode 260 may substantially fill the trench and may have a planar top surface as shown in FIG. 2i.

Figure 2J:
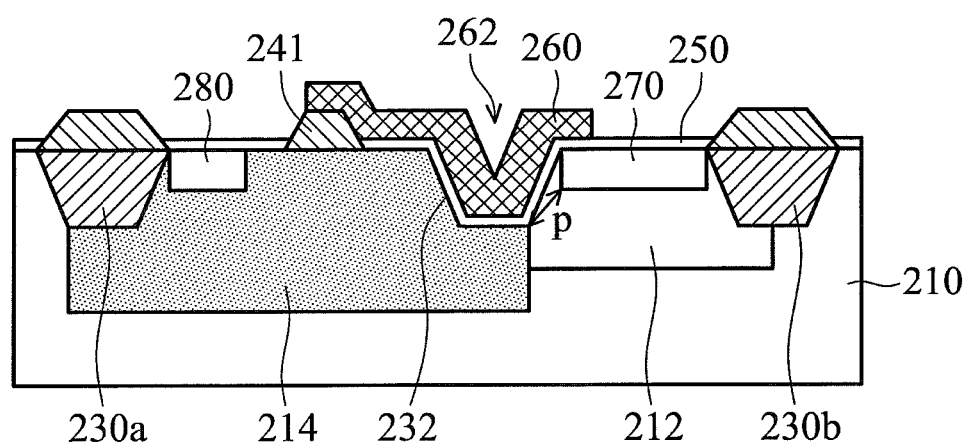

Referring to FIG. 2j, a source region 270 is formed in the body region 212 and a drain region 280 is formed in the drift region 214. The source and drain regions 270 and 280 may be formed by a doping process commonly used in the art, such as an ion implantation process.

Features that are commonly found in a conventional semiconductor device such as an inter-layer dielectric (ILD) layer and source/drain electrodes (not shown) may be formed to complete the formation of the semiconductor device 200. The formations of such features are known in the art, and hence will not be discussed herein.

The disclosed embodiments provide a semiconductor device 200 having a gate electrode 260 formed in a trench 232. The disclosed embodiments provide at least the following advantages over the conventional semiconductor device. First, the gate electrode 260 that extends into the trench 232 provides a shorter pitch P (shown in FIG. 2j) for the current flow, which leads to low on-resistance (R$_{on}$) of the semiconductor device 200. Second, due the design of the gate electrode 260, the breakdown voltage level may be maintained while reducing the on-resistance of the semiconductor device 200.

It should be realized, the semiconductor devices 200 illustrated in the figures are provided with one trench formed on the gate electrode. However, according to design requirements, the number of trenches on the gate electrode may be more than one as long as a shorter pitch is provided.

Figure 3A:
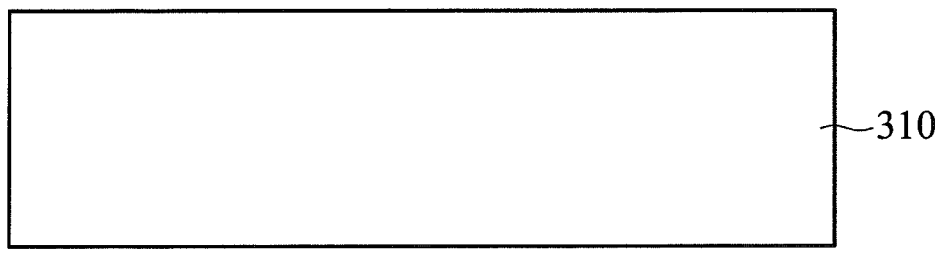
FIG. 3a-3j illustrate a step-by-step procedure for fabricating a semiconductor device in accordance with other embodiments of the present disclosure.
Figure 3B:
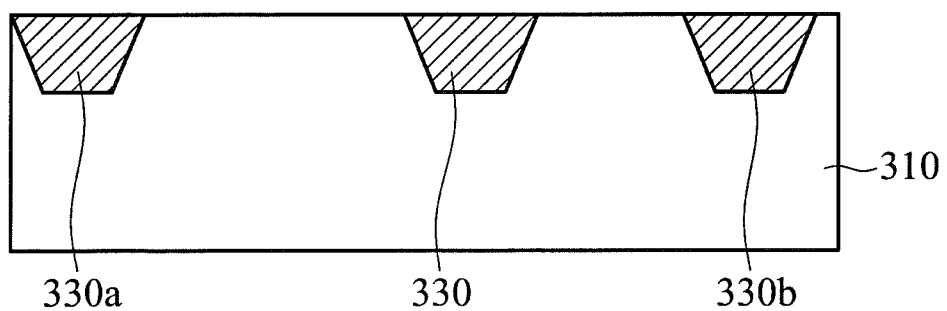
Figure 3C:
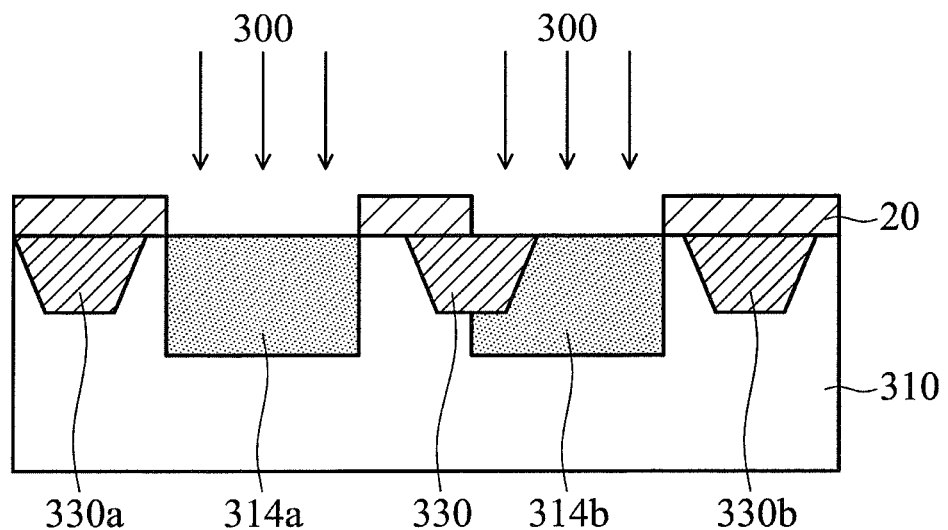

FIGS. 3a-3j illustrate a step-by-step procedure for fabricating a semiconductor device 300 in accordance with other embodiments of the present disclosure, in which FIGS. 3a-3c illustrate the formation of a body region and a pair of diffusion extension regions of the semiconductor device 300 in accordance with an embodiments of the present disclosure. Referring to FIG. 3a, a substrate 310 having a first conductivity type is provided. The substrate 310 may be a bulk silicon substrate, a silicon-on-insulator (SOI) substrate, or the like. In some embodiments, the substrate 310 may have a first conductivity type of p-type, such as a boron doped substrate. In other embodiments, the substrate 310 may have a first conductivity type of n-type, such as a phosphor or arsenic substrate. Any other suitable substrates may also be used, such as a compound semiconductor substrate, or multilayer substrate.

Referring to FIG. 3b, a plurality of isolation structures 330, 330a, and 330b are formed. A portion of the isolation structure 330 may extend into the diffusion extension region 314b. In an embodiment, the isolation structures 330, 330a, and 330b may be shallow trench isolations (STIs). Conventional processes for forming STIs may be used to form STI 230, and hence are not illustrated in detail in the figures. Such processes may include: sequentially forming a first insulating layer (for example, silicon oxide (SiO$_x$)) and a second insulating layer (for example, silicon nitride (SiN$_x$)) over the substrate 310; forming a trench in the substrate 310 by selectively etching the first and second insulating layers and the substrate 310; growing a liner that is rich in nitrogen (for example, silicon oxynitride (Si$_x$O$_y$N$_z$)) on the surface or sidewalls of the trench; depositing (by a deposition process, such as chemical vapor deposition (CVD)) a gap fill material (for example, silicon dioxide, or borophososilicate glass) on the surface of the substrate 310, wherein the gap fill material fills the trench; applying an anneal process to the gap fill material; and planarizing (by conventional method such as chemical mechanical polish (CMP)) the substrate 310 to remove the excess gap fill layer such that the portion of gap fill material in the trench is level with the top surface of the substrate. It should be noted, the above processes are merely examples, and hence the invention should not be limited to it.

Referring to FIG. 3c, a patterned mask layer 20 is formed over the substrate 310, exposing predetermined extension regions. The patterned mask layer 20 may be a photoresist layer or a hard mask layer such as a silicon nitride or a silicon oxynitride layer or the like. A doping process 300 is performed to selectively dope a dopant having a second conductivity type, into the semiconductor substrate 310 to define a pair of diffusion extension regions 314a and 314b. The second conductivity type is different from the first conductivity type. The patterned mask layer 20 is removed after the diffusion extension regions 314a and 314b are formed.

Figure 3D:
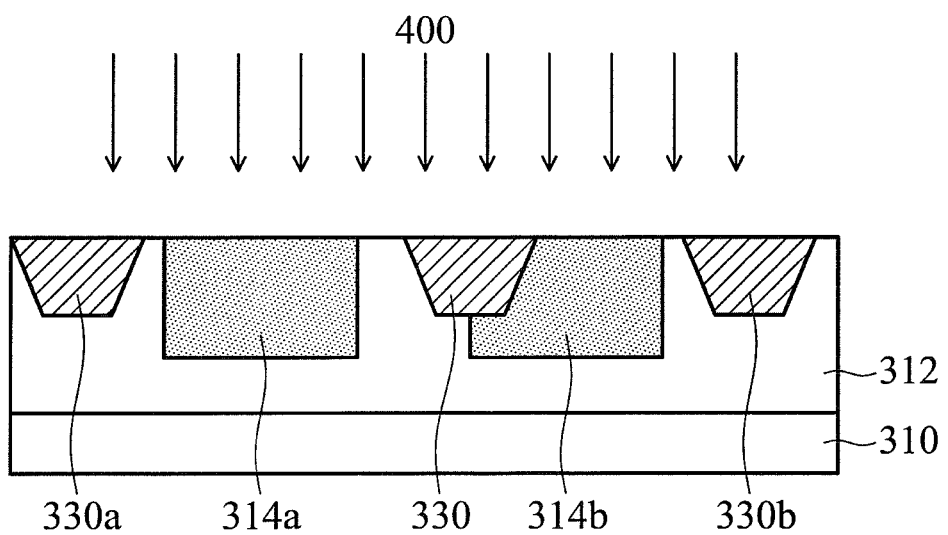

After the diffusion extension regions 314a and 314b are formed. As shown in FIG. 3d, a doping process 400 is performed to (selectively) implant a dopant of a first conductivity type into a predetermined region of the semiconductor substrate 310 to define a body region 312, as shown in FIG. 3d. In some exemplary embodiments, the concentration of the substrate 310 may be greater than that of the body region 312. For example, when the body region 312 is p-type, the substrate 310 may be heavily doped p-type (P+).

Figure 3E:
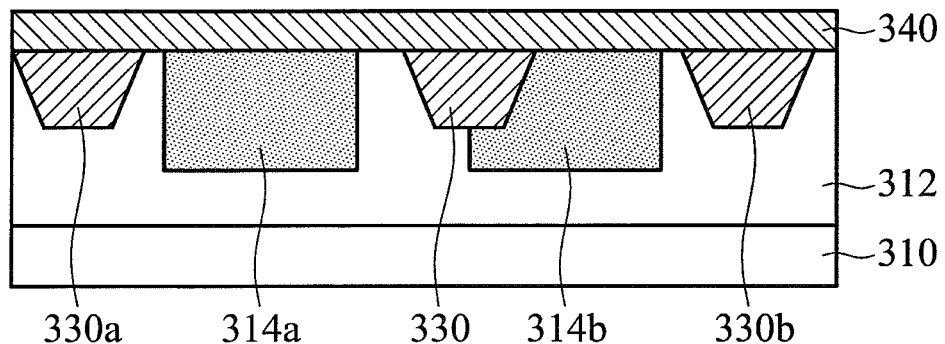

After the steps shown in FIG. 3d, a dielectric layer 340 is formed over the substrate 310 as shown in FIG. 3e. The dielectric layer 340 comprises silicon oxide, silicon nitride, silicon oxynitride, high-k dielectrics, other suitable dielectric materials for gate dielectrics, or combinations thereof. High-k dielectrics may comprise metal oxides, for example, oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. The dielectric layer 340 may be formed by an ordinary process known in the art, such as atomic layer deposition (ALD), chemical vapor deposition (CVD), physical vapor deposition (PVD), thermal oxidation, UV-ozone oxidation, or combinations thereof. The dielectric layer 340 may have a thickness from about 2000 angstroms to 10,000 angstroms.

Figure 3F:
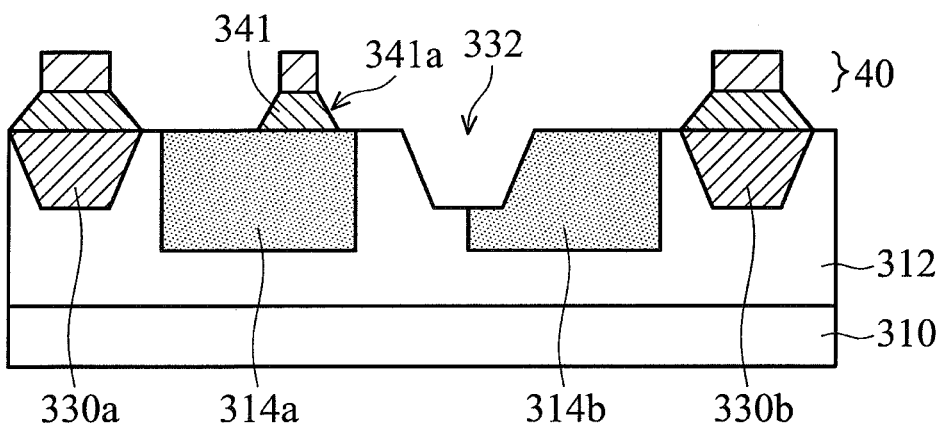

Referring to FIG. 3f, an etching process 500 is performed using a patterned mask layer 40 to remove the isolation structure 330 to form a trench 332 and remove a portion of the dielectric layer 340 to form a gate dielectric layer 341 adjacent to the trench 332. The gate dielectric layer 341 may have a slant sidewall 341a formed on at least one of its edges. Although FIG. 3f shows a slant sidewall, it should be realized that the sidewall 341a may also be in a vertical sidewall or in any other shapes. In some embodiments, the etching process 500 may be a dry etching process, wet etching process, or the like. The patterned mask layer 40 may be a photoresist layer or a hard mask layer such as a silicon nitride or a silicon oxynitride layer or the like. The patterned mask layer 40 is removed after the etching process 500.

Figure 3G:
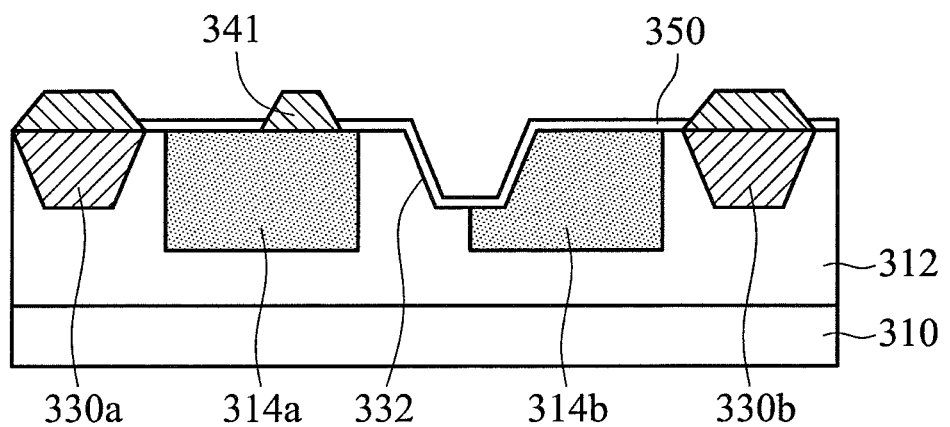

Referring to FIG. 3g, a liner 350 lining the trench 332 and adjoining with the gate dielectric layer 341 is formed. The liner 350 may also cover the top surface of the substrate exposed by the gate dielectric layer 341. In an embodiment, the liner 350 may be formed by oxidizing the substrate 310 through an oxidation process, such as thermal oxidation, UV-zone oxidation, or the like. In another embodiment, the liner 350 may be formed by a deposition process, such as chemical vapor deposition (CVD), physical vapor deposition (PVD), or the like. The liner 350 may be thinner than the gate dielectric layer 341. In some embodiments, the liner 350 may have a thickness of between about 100-500 angstroms.

Figure 3H:
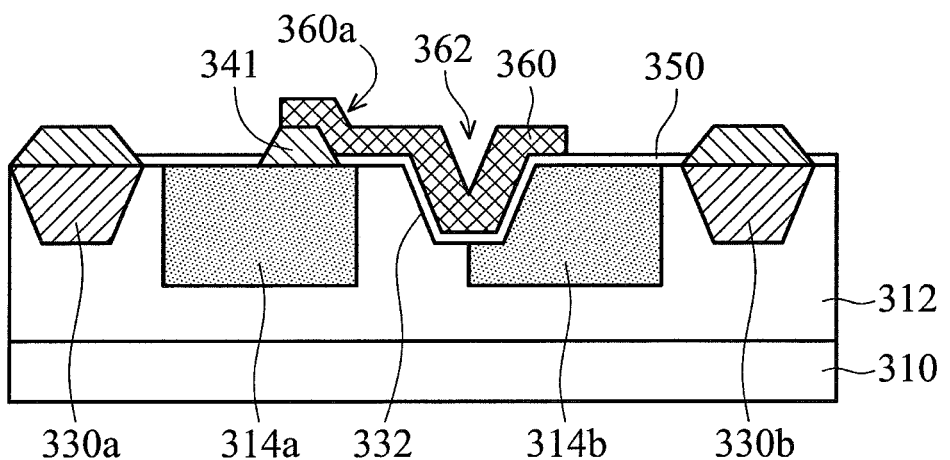
Figure 3I:
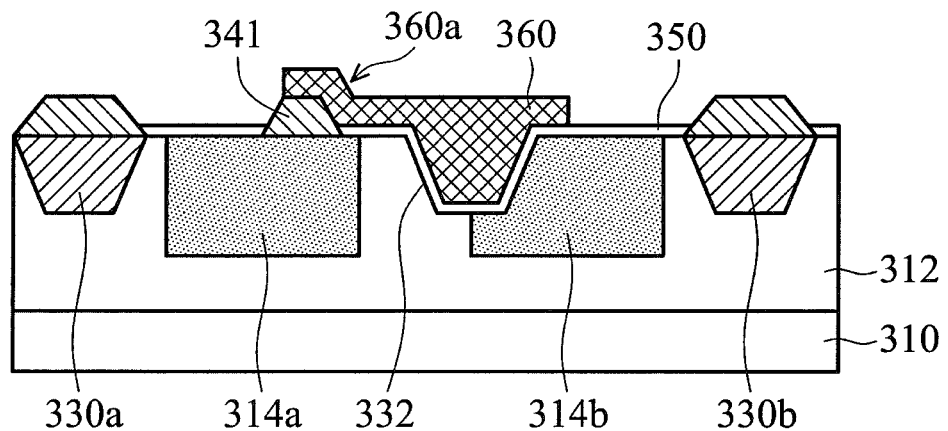

Referring to FIG. 3h, a gate electrode 360 is formed over the gate dielectric layer 341 and a portion of the liner 350. The gate electrode 360 at least partially extends into the trench 332. The gate electrode 360 may be formed of a material comprising metal, polysilicon, tungsten silicide ($WSi_2$), or combinations thereof. The gate electrode 360 may be formed using a process such as low-pressure chemical vapor deposition (LPCVD), plasma enhanced chemical vapor deposition (PECVD), other suitable processes, or combinations thereof. The gate electrode 260 may have a step 360a owing to the height difference between the gate dielectric layer 341 and the liner 350. In one embodiment, the gate electrode 360 may be formed conformally in the trench, thus providing a concave portion 262 corresponding to the trench 332. In another embodiment, the gate electrode 360 may substantially fill the trench 332 and have a planar top surface as shown in FIG. 3i.

Figure 3J:
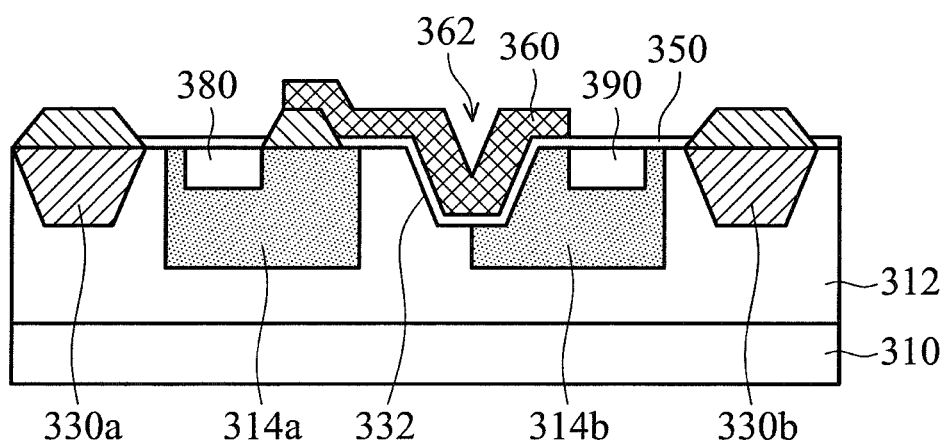

Referring to FIG. 3j, a source region 370 is formed in the diffusion extension region 314b and a drain region 380 is formed in the diffusion extension region 314a. The source and drain regions 370 and 380 may be formed by a doping process commonly used in the art, such as an ion implantation process.

Features that are commonly found in a conventional semiconductor device such as inter-layer dielectric (ILD) layer and source/drain electrodes (not shown) may be formed to complete the formation of the semiconductor device 300. The formations of such features are known in the art, and hence will not be discussed herein.

The disclosed embodiments provide a gate electrode 360 formed in a trench 332 of a double diffusion semiconductor device 300. The gate electrode 360 that extends into the trench provides a shorter pitch for the current flow, which leads to low on-resistance ($R_{on}$) of the semiconductor device while maintaining the breakdown voltage value of the semiconductor device.

It should be realized, the semiconductor devices illustrated in the figures are provided with one trench formed on the gate electrode. However, according to design requirements, the number of trenches on the gate electrode may be more than one as long as a shorter pitch is provided.

Although the embodiments illustrate specific semiconductor devices; however, it should be understood that the gate electrode that extends into the isolation structure may be applied to other semiconductor devices, such as a MOSFET, EDMOS, etc.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a substrate having a first conductivity type, comprising:
      a body region having the first conductivity type;
      a source region formed in the body region;
      a drift region having a second conductivity type adjacent to the body region, wherein the first conductivity type is opposite to the second conductivity type; and
      a drain region formed in the drift region;
   a trench formed in the substrate between the body and drift regions;
   a gate dielectric layer disposed adjacent to the trench and disposed only on a top surface of the substrate;
   a liner lining the trench and adjoining with the gate dielectric layer; and
   a gate electrode formed over the gate dielectric layer and extending into the trench.

2. The semiconductor device of claim 1, wherein the liner is thinner than the gate dielectric layer.

3. The semiconductor device of claim 2, wherein the liner has a thickness of between 100-500 angstroms.

4. The semiconductor device of claim 2, wherein the gate dielectric layer has a thickness of between 2,000-10,000 angstroms.

5. The semiconductor device of claim 1, wherein the gate electrode is recessed at the trench.

6. The semiconductor device of claim 1, wherein the gate electrode completely fills the trench and forms a planar top surface over the trench.

7. The semiconductor device of claim 1, wherein the gate electrode comprises metal, polysilicon, metal silicide, or combinations thereof.

8. A semiconductor device, comprising:
   a substrate having a first conductivity type having a body region;
   a pair of diffusion extension regions having a second conductivity type extending from a top surface of the body region into the body region, wherein the second conductivity type is opposite to the first conductivity type;
   a source region formed in one of the diffusion extension regions and a drain region formed in another one of the diffusion extension regions;
   a trench formed in one of the diffusion extension regions and extending into a portion of the body region between the pair of diffusion extension regions;
   a gate dielectric layer disposed adjacent to the trench and disposed only on the top surface of the body region;
   a liner lining the trench and adjoining with the gate dielectric layer; and
   a gate electrode formed over the gate dielectric layer and extending into the trench.

9. The semiconductor device of claim 8, wherein the liner is thinner than the gate dielectric layer.

10. The semiconductor device of claim 9, wherein the liner has a thickness of between 100-500 angstroms.

11. The semiconductor device of claim 9, wherein the gate dielectric layer has a thickness of between 2,000-10,000 angstroms.

12. The semiconductor device of claim 8, wherein the gate electrode is recessed at the trench.

13. The semiconductor device of claim 8, wherein the gate electrode completely fills the trench and forms a planar top surface over the trench.

14. The semiconductor device of claim 8, wherein the gate electrode comprises metal, polysilicon, metal silicide, or combinations thereof.

15. A method for fabricating a semiconductor device, comprising:
   providing a substrate having a first conductivity type;
   forming a body region having the first conductivity type in the substrate;
   forming a drift region having a second conductivity type adjacent to the body region in the substrate, wherein the second conductivity type is opposite to the first conductivity type;

forming a shallow trench isolation (STI) in the substrate between the body and drift regions;

forming a dielectric layer over the substrate;

removing the STI and a portion of the dielectric layer to form a trench and a gate dielectric layer adjacent to the trench, respectively, wherein the gate dielectric layer is disposed only on a top surface of the substrate;

forming a liner lining the trench and adjoining with the gate dielectric layer;

forming a gate electrode over the gate dielectric layer and extending into the trench; and forming a source region in the body region and a drain region in the drift region.

16. The method of claim 15, wherein the liner is thinner than the gate dielectric layer.

17. The method of claim 15, wherein the gate electrode is recessed at the trench.

18. The method of claim 15, wherein the gate electrode completely fills the trench and forms a planar top surface over the trench.

19. The method of claim 15, wherein the gate electrode comprises metal, polysilicon, metal silicide, or combinations thereof.

20. A method for fabricating a semiconductor device, comprising:

providing a substrate having a first conductivity type;

forming a body region having the first conductivity type in the substrate;

forming a pair of diffusion extension regions having a second conductivity type in the body region, wherein the second conductivity type is opposite to the first conductivity type;

forming a shallow trench isolation (STI) in one of the diffusion extension regions, wherein the STI extends into a portion of the body region between the pair of diffusion extension regions;

forming a dielectric layer over the substrate;

removing the STI and a portion of the dielectric layer to form a trench and a gate dielectric layer adjacent to the trench, respectively, wherein the gate dielectric layer is disposed only on a top surface of the body region;

forming a liner lining the trench and adjoining with the gate dielectric layer;

forming a gate electrode over the gate dielectric layer and extending into the trench; and forming a source region in one of the diffusion extension regions and a drain region in the other one of the diffusion extending regions.

21. The method of claim 20, wherein the liner is thinner than the gate dielectric layer.

22. The method of claim 20, wherein the gate electrode is recessed at the trench.

23. The method of claim 20, wherein the gate electrode completely fills the trench and forms a planar top surface over the trench.

24. The method of claim 20, wherein the gate electrode comprises metal, polysilicon, metal silicide, or combinations thereof.

* * * * *